(12) United States Patent
Kuraguchi et al.

(10) Patent No.: US 9,461,122 B2
(45) Date of Patent: Oct. 4, 2016

(54) SEMICONDUCTOR DEVICE AND MANUFACTURING METHOD FOR THE SAME

(71) Applicant: Kabushiki Kaisha Toshiba, Minato-ku (JP)

(72) Inventors: Masahiko Kuraguchi, Yokohama (JP); Hisashi Saito, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/642,146

(22) Filed: Mar. 9, 2015

(65) Prior Publication Data
US 2015/0270355 A1    Sep. 24, 2015

(30) Foreign Application Priority Data
Mar. 19, 2014  (JP) ................. 2014-057282

(51) Int. Cl.
*H01L 29/40* (2006.01)
*H01L 29/20* (2006.01)
(Continued)

(52) U.S. Cl.
CPC ....... *H01L 29/2003* (2013.01); *H01L 29/0619* (2013.01); *H01L 29/66431* (2013.01); *H01L 29/66462* (2013.01); *H01L 29/778* (2013.01); *H01L 29/7786* (2013.01);
(Continued)

(58) Field of Classification Search
CPC ........... H01L 29/2003; H01L 29/0619; H01L 29/66431; H01L 29/66462; H01L 29/778; H01L 29/7786; H01L 29/402; H01L 29/404; H01L 29/4236
See application file for complete search history.

(56) References Cited

U.S. PATENT DOCUMENTS

| 2005/0189559 A1 | 9/2005 | Saito et al. |
| 2007/0029599 A1 | 2/2007 | Nakajima |

(Continued)

FOREIGN PATENT DOCUMENTS

| JP | 2005-244072 | 9/2005 |
| JP | 2006-513580 | 4/2006 |

(Continued)

OTHER PUBLICATIONS

Office Action issued Aug. 14, 2015 in European Patent Application No. 15 157 014.0.

(Continued)

*Primary Examiner* — Fernando L Toledo
*Assistant Examiner* — Neil Prasad
(74) *Attorney, Agent, or Firm* — Oblon, McClelland, Maier & Neustadt, L.L.P.

(57) ABSTRACT

A semiconductor device includes: a first GaN based semiconductor layer (hereinafter abbreviated as GaN layer); a second GaN layer on the first GaN layer and having a bandgap larger than that of the first GaN layer; a source electrode on the second GaN layer; a drain electrode on the second GaN layer; a gate electrode between the source electrode and the drain electrode, a gate insulating film between the gate electrode and the first GaN layer, a film thickness of the second GaN layer between the gate electrode and the first GaN layer being thinner than that of the second GaN layer between the source electrode and the first GaN layer; and a p-type third GaN layer between the second GaN layer and an end portion on the drain electrode side of the gate electrode, the gate insulating film between the gate electrode and the third GaN layer.

11 Claims, 11 Drawing Sheets

(51) Int. Cl.
*H01L 29/66* (2006.01)
*H01L 29/778* (2006.01)
*H01L 29/06* (2006.01)
*H01L 29/423* (2006.01)

(52) U.S. Cl.
CPC .......... *H01L 29/402* (2013.01); *H01L 29/404* (2013.01); *H01L 29/4236* (2013.01)

(56) References Cited

U.S. PATENT DOCUMENTS

| | | | |
|---|---|---|---|
| 2007/0045670 A1 | 3/2007 | Kuraguchi | |
| 2009/0206371 A1 | 8/2009 | Oka | |
| 2010/0210080 A1* | 8/2010 | Nomura | H01L 29/2003 438/197 |
| 2012/0146093 A1 | 6/2012 | Shibata et al. | |
| 2012/0267642 A1 | 10/2012 | Jeon et al. | |
| 2013/0062693 A1 | 3/2013 | Tanaka | |
| 2013/0140578 A1 | 6/2013 | Yu et al. | |
| 2014/0084300 A1* | 3/2014 | Okamoto | H01L 29/2003 257/76 |
| 2014/0264274 A1* | 9/2014 | Nakayama | H01L 29/66462 257/20 |

FOREIGN PATENT DOCUMENTS

| | | |
|---|---|---|
| JP | 2007-67240 | 3/2007 |
| JP | 2009-231458 | 10/2009 |
| JP | 2009-246205 | 10/2009 |
| JP | 2012-231108 | 11/2012 |
| JP | 2013-58662 | 3/2013 |
| JP | 2013-93482 | 5/2013 |
| JP | 2013-149851 | 8/2013 |
| JP | 2013-191637 A | 9/2013 |
| TW | 200535949 A | 11/2005 |
| TW | 201222810 A1 | 6/2012 |
| WO | WO 2004/068590 A1 | 8/2004 |

OTHER PUBLICATIONS

Extended European Search Report issued Jan. 29, 2016 in Patent Application No. 15157014.0.

Combined Taiwanese Office Action and Search Report issued Feb. 2, 2016 in Patent Application No. 104106324 (with English language translation).

Tetsu Kachi, et al., "GaN Power Device and Reliability for Automotive Applications" Reliability Physics Symposium (IRPS), IEEE. XP032204901, 2012, pp. 3D.1.1-3D.1.4.

Shuichi Yagi, et al., "GaN/AlGaN/GaN Polarization Junction Schottky Barrier Diode" 58th Spring Meeting of Japan Society of Applied Physics, 2011, 1 page.

* cited by examiner

SEMICONDUCTOR DEVICE AND MANUFACTURING METHOD FOR THE SAME

CROSS-REFERENCE TO RELATED APPLICATION

This application is based upon and claims the benefit of priority from Japanese Patent Application No. 2014-057282, filed on Mar. 19, 2014, the entire contents of which are incorporated herein by reference.

FIELD

Embodiments described herein relate generally to a semiconductor device and a manufacturing method therefor.

BACKGROUND

A semiconductor device such as a switching device and a diode is used for a circuit such as a switching power source and an inverter. These semiconductor devices are required to have high breakdown voltage and low on-resistance. Further, a relation between the breakdown voltage and the on-resistance has a trade-off relation determined by a device material.

By the progress of technological development till today, low on-resistance of a semiconductor device nearly up to a limit of silicon has been realized. In order to further improve the breakdown voltage and further reduce the on-resistance, it is necessary to change the device material from silicon. By adopting a wide bandgap semiconductor such as GaN based semiconductor like GaN and AlGaN or Silicon Carbide (SiC) as the switching device material, the trade-off relation determined by the material can be improved and it is possible to dramatically raise the breakdown voltage and reduce the on-resistance.

DETAILED DESCRIPTION

Figure 1:
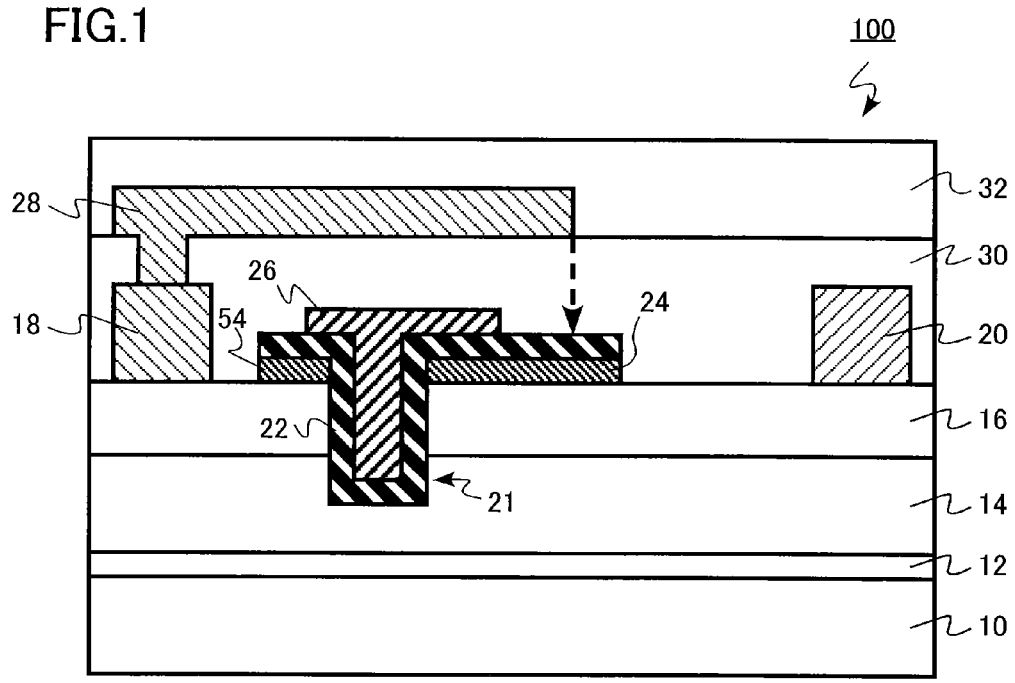
FIG. 1 is a schematic cross-sectional view illustrating a semiconductor device according to a first embodiment.

A semiconductor device according to an embodiment of the present technology includes: a first GaN based semiconductor layer; a second GaN based semiconductor layer disposed on the first GaN based semiconductor layer, the second GaN based semiconductor layer having a bandgap larger than a bandgap of the first GaN based semiconductor layer; a source electrode disposed on the second GaN based semiconductor layer; a drain electrode disposed on the second GaN based semiconductor layer; a gate electrode disposed between the source electrode and the drain electrode, a gate insulating film being disposed between the gate electrode and the first GaN based semiconductor layer, a film thickness of the second GaN based semiconductor layer between the gate electrode and the first GaN based semiconductor layer being thinner than a film thickness of the second GaN based semiconductor layer between the source electrode and the first GaN based semiconductor layer; and a p-type third GaN based semiconductor layer disposed between the second GaN based semiconductor layer and an end portion on the drain electrode side of the gate electrode, the gate insulating film being disposed between the gate electrode and the third GaN based semiconductor layer.

In the present specification, note that same or equivalent components are denoted by same reference signs, and there may be a case where repetition of the description is omitted.

In the present specification, "GaN based semiconductor" is a generic term for GaN (gallium nitride), AlN (aluminum nitride), InN (indium nitride), and a semiconductor including these intermediate compositions.

In the present specification, "undoped" means that impurity concentration is $1\times10^{15}$ cm$^{-3}$ or less.

In the present specification, "acceptor" means a p-type impurity activated inside the semiconductor.

In the present specification, an upward direction of the drawing is described as "up" and a downward direction of the drawing as "down" in order to show a positional relation of components and the like. In the present specification, note that concepts of "up" and "down" do not necessarily indicate a relation with a gravity direction.

(First Embodiment)

A semiconductor device according to a present embodiment includes: a first GaN based semiconductor layer; a second GaN based semiconductor layer disposed on the first GaN based semiconductor layer, the second GaN based semiconductor layer having a bandgap larger than a bandgap of the first GaN based semiconductor layer; a source electrode disposed on the second GaN based semiconductor layer; a drain electrode disposed on the second GaN based semiconductor layer; a gate electrode disposed between the source electrode and the drain electrode, a gate insulating film being disposed between the gate electrode and the first GaN based semiconductor layer, a film thickness of the second GaN based semiconductor layer between the gate electrode and the first GaN based semiconductor layer being thinner than a film thickness of the second GaN based semiconductor layer between the source electrode and the first GaN based semiconductor layer; and a p-type third GaN based semiconductor layer disposed between the second GaN based semiconductor layer and an end portion on the drain electrode side of the gate electrode, the gate insulating film being disposed between the gate electrode and the third GaN based semiconductor layer.

FIG. 1 is a schematic cross-sectional view illustrating the semiconductor device according to the present embodiment. The semiconductor device according to the present embodiment is an HEMT (High Electron Mobility Transistor) using the GaN based semiconductor. Further, the HEMT according to the present embodiment includes a so-called recessed gate structure in which a gate electrode is embedded in a groove formed on a semiconductor layer.

As illustrated in FIG. 1, a semiconductor device (HEMT) 100 includes a substrate 10, a buffer layer 12, a channel layer (first GaN based semiconductor layer) 14, a barrier layer (second GaN based semiconductor layer) 16, a source electrode 18, a drain electrode 20, a gate insulating film 22, a resurf layer (third GaN based semiconductor layer) 24, a gate electrode 26, and a source field plate electrode (first field plate electrode) 28. An insulating film 30 is disposed between the source field plate electrode 28 and each of the gate electrode 26 and resurf layer 24. Further, an insulating film 32 is disposed on the source field plate electrode 28.

The substrate 10 is formed of, for example, silicon (Si). Besides silicon, sapphire ($Al_2O_3$) or silicon carbide (SiC) may be also applicable, for example.

The buffer layer 12 is disposed on the substrate 10. The buffer layer 12 has a function to reduce lattice misalignment between the substrate 10 and the channel layer 14. The buffer layer 12 is formed of, for example, a multi-layer structure of aluminum nitride gallium ($Al_WGa_{1-W}N$ (0<W<1)).

The channel layer 14 is disposed on the buffer layer 12. The channel layer 14 is, for example, undoped $Al_XGa_{1-X}N$ (0≤X<1). More specifically, the channel layer 14 is undoped GaN, for example. The channel layer 14 has film thickness of 0.5 μm or more and 3 μm or less, for example.

The barrier layer 16 is disposed on the channel layer 14. The barrier layer 16 has the bandgap larger than the bandgap of the channel layer 14. The barrier layer 16 is, for example, undoped $Al_YGa_{1-Y}N$ (0<Y≤1, X<Y). More specifically, the barrier layer is undoped $Al_{0.2}Ga_{0.8}N$, for example. The barrier layer 16 has the film thickness 15 nm or more and 50 nm or less, for example.

A heterojunction interface is formed between the channel layer 14 and the barrier layer 16. When the HEMT 100 is turned on, two-dimensional electron gas (2DEG) is formed on the heterojunction interface and becomes carrier.

The source electrode 18 and the drain electrode 20 are formed on the barrier layer 16. The source electrode 18 and the drain electrode 20 are, for example, metal electrodes, and the metal electrode includes, for example, a stacked structure of titanium (Ti) and aluminum (Al). Preferably, ohmic contact is provided between the barrier layer 16 and each of the source electrode 18 and the drain electrode 20. A distance between the source electrode 18 and the drain electrode 20 is, for example, 5 μm or more and 30 μm or less.

The gate insulating film 22 is formed on an inner surface of a trench 21 formed at the barrier layer 16 between the source electrode 18 and the drain electrode 20. The gate electrode 26 is disposed on the gate insulating film 22. The inside of the trench 21 is embedded with the gate electrode 26. A bottom portion of the trench 21 is located at the channel layer 14.

In other words, the gate electrode 26 is disposed between the source electrode 18 and the drain electrode 20, interposing the gate insulating film 22 between the barrier layer 16 and the channel layer 14. The film thickness of the barrier layer 16 at a portion where the gate electrode 26 is closest to the channel layer 14 is thinner than the film thickness of the barrier layer 16 in other areas, for example, between the source electrode 18 and the channel layer 14. Meanwhile, according to the present embodiment, since the bottom portion of the trench 21 reaches the channel layer 14, the film thickness of the barrier layer 16 between the channel layer 14 and the portion of the gate electrode 26 closest to the channel layer 14 is zero.

The HEMT 100 according to the present embodiment includes the recessed gate structure. Further, the bottom portion of the trench 21 reaches the channel layer 14 and an MIS (Metal Insulator Semiconductor) structure is formed just below the gate electrode 26. Formation of an inversion layer and a depletion layer inside the channel layer 14 is controlled by voltage applied to the gate electrode 26, and on/off of the channel is controlled. Therefore, a normally-off type HEMT can be formed.

The gate insulating film 22 is, for example, a silicon oxide film or an aluminum oxide film (alumina film). Further, the gate electrode 26 is, for example, a metal electrode. The metal electrode is, for example, titanium nitride (TiN).

The p-type resurf (RESURF: Reduced Surface Field) layer 24 is disposed between the gate electrode 26 and the drain electrode 20 on the barrier layer 16. The gate insulating film 22 is interposed between the gate electrode 26 and the resurf layer 24.

The resurf layer 24 is disposed between the barrier layer 16 and a portion of the gate electrode 26 closest to the drain electrode 20, namely, an end portion on the drain electrode 20 side of the gate electrode 26.

The resurf layer 24 is, for example, p-type $Al_ZGa_{1-Z}N$ (0≤Z<1). More specifically, the cap layer is p-type GaN, for example. The resurf layer 24 includes a p-type impurity. The p-type impurity is, for example, magnesium (Mg).

The resurf layer 24 is a floating layer. In other words, the resurf layer is not electrically connected to a grounding wire, a power source, a signal source, etc. Therefore, the resurf layer 24 is not electrically connected to the source electrode 18, drain electrode 20, and gate electrode 26.

The resurf layer 24 has a function to alleviate mainly a lateral electric field. According to the present embodiment, the resurf layer 24 is disposed directly contacting the barrier layer 16. Since the resurf layer 24 is the floating layer, hole injection from the resurf layer 24 does not occur. Therefore, a switch speed is not degraded by presence of the resurf layer 24.

Further, a p-type resurf layer (fourth GaN based semiconductor layer) 54 is disposed between the gate electrode 26 and the source electrode 18 on the barrier layer 16. The gate insulating film 22 is interposed between the gate electrode 26 and the resurf layer 54.

The resurf layer 54 is disposed between the barrier layer 16 and a portion of the gate electrode 26 closest to the source electrode 18, namely, an end portion on the source electrode 18 side of the gate electrode 26.

The resurf layer 54 is, for example, p-type $Al_ZGa_{1-Z}N$ ($0 \leq Z < 1$). More specifically, resurf layer is p-type GaN, for example. The resurf layer 54 includes a p-type impurity. The p-type impurity is, for example, magnesium (Mg).

The resurf layer 54 is a floating layer. In other words, the resurf layer is not electrically connected to a grounding wire, a power source, a signal source, etc. Therefore, the resurf layer 54 is not electrically connected to the source electrode 18, drain electrode 20, and gate electrode 26.

The resurf layer 54 has a function to alleviate mainly the lateral electric field. According to the present embodiment, the resurf layer 54 is disposed directly contacting the barrier layer 16. Since the resurf layer 54 is the floating layer, hole injection from the resurf layer 54 does not occur. Therefore, a switch speed is not degraded by presence of the resurf layer 54.

The insulating film 30 is disposed on the gate electrode 26 and the resurf layer 24. The insulating film 30 is, for example, a silicon oxide film or a silicon nitride film.

The source field plate electrode (first field plate electrode) 28 is disposed interposing the insulating film 30 in a space with the gate electrode 26 and the space with the resurf layer 24. As illustrated by a dotted arrow in FIG. 1, the resurf layer 24 is located between the barrier layer 16 and the end portion on the drain electrode 20 side of the source field plate electrode 28. In other words, the resurf layer 24 is located just below the end portion on the drain electrode 20 side of the source field plate electrode 28.

The source field plate electrode 28 is electrically connected to the source electrode 18. The source field plate electrode 28 has a function to alleviate mainly the lateral electric field.

The insulating film 32 is disposed on the source field plate electrode 28. The insulating film 32 is, for example, a silicon oxide film or a silicon nitride film.

Next, an exemplary manufacturing method for the semiconductor device according to the present embodiment will be described. FIGS. 2 to 6 are schematic cross-sectional views illustrating the semiconductor device in process of manufacture in the manufacturing method for the semiconductor device according to the present embodiment.

The manufacturing method for the semiconductor device according to the present embodiment includes: forming a second GaN based semiconductor layer on a first GaN based semiconductor layer by an epitaxial growth process, the second GaN based semiconductor layer having a bandgap larger than a bandgap of the first GaN based semiconductor layer; forming a third p-type GaN based semiconductor layer on the second GaN based semiconductor layer; forming a trench that penetrates through the third p-type GaN based semiconductor layer and reaches the second GaN based semiconductor layer; forming a gate insulating film on the trench and a surface of the third GaN based semiconductor layer; forming a gate electrode on the gate insulating film; forming a source electrode on one side of the gate electrode on the second GaN based semiconductor layer; and forming a drain electrode on the other side of the gate electrode on the second GaN based semiconductor layer.

First, the substrate 10, for example, a Si substrate is prepared. Next, the buffer layer 12 is grown on the Si substrate, for example, by epitaxial growth.

Next, the undoped GaN to be the channel layer (first GaN based semiconductor layer) 14 and the undoped $Al_{0.2}Ga_{0.8}N$ to be the barrier layer (second GaN based semiconductor layer) 16 are formed on the buffer layer 12 by the epitaxial growth.

Figure 2:
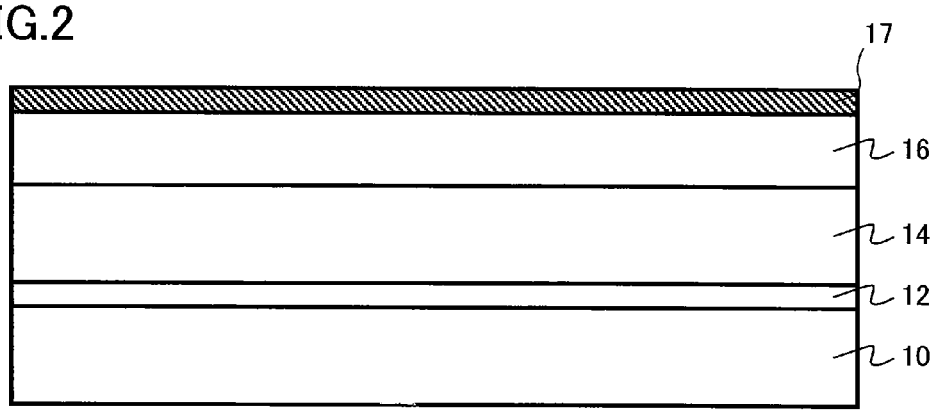
FIG. 2 is a schematic cross-sectional view illustrating the semiconductor device in process of manufacture in a manufacturing method for the semiconductor device according to the first embodiment.

Next, the p-type GaN (third GaN based semiconductor layer) 17 to be the resurf layer (third GaN based semiconductor layer) 24 later is formed on the barrier layer 16 by the epitaxial growth (FIG. 2).

Figure 3:
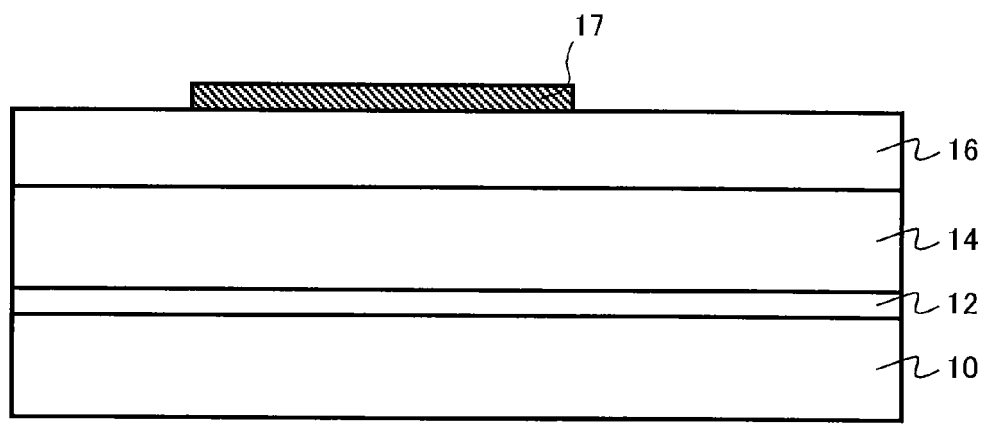
FIG. 3 is a schematic cross-sectional view illustrating the semiconductor device in process of manufacture in the manufacturing method for the semiconductor device according to the first embodiment.

Next, patterning is applied to the p-type GaN 17 (FIG. 3).

Figure 4:
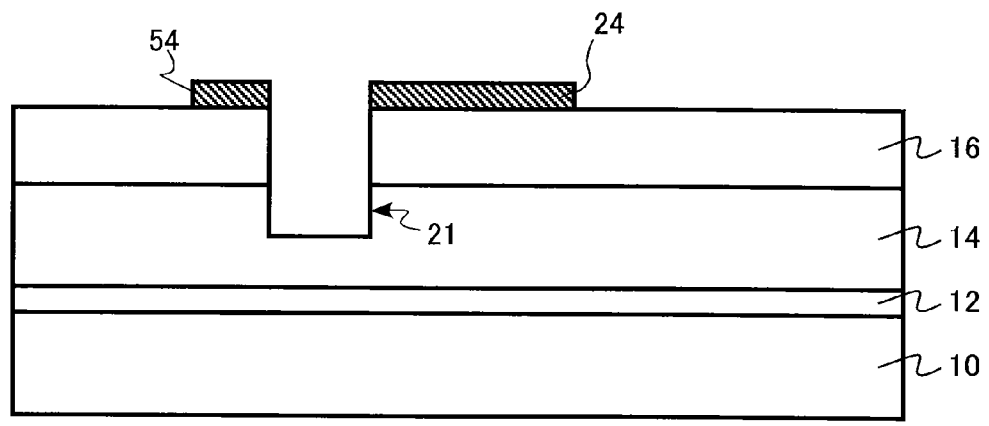
FIG. 4 is a schematic cross-sectional view illustrating the semiconductor device in process of manufacture in the manufacturing method for the semiconductor device according to the first embodiment.

Next, the trench 21 penetrating through the p-type GaN 17 and reaching the barrier layer 16 and the channel layer 14 is formed by, for example, RIE (Reactive Ion Etching) process (FIG. 4).

Figure 5:
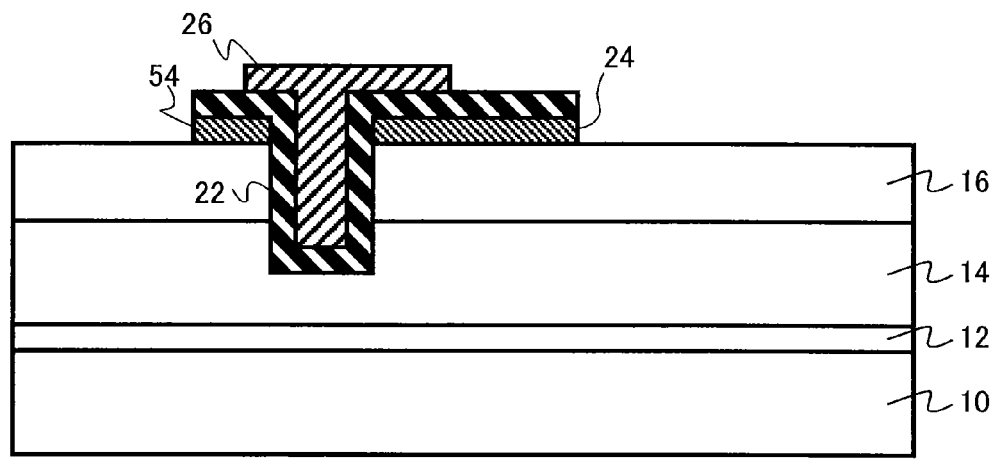
FIG. 5 is a schematic cross-sectional view illustrating the semiconductor device in process of manufacture in the manufacturing method for the semiconductor device according to the first embodiment.

Then, the gate insulating film 22, namely, the silicon oxide film, is formed on the trench 21 and a surface of the p-type GaN 17 is formed by CVD (Chemical Vapor Deposition) method, for example. Next, the gate electrode 26 made of TiN is formed on the gate insulating film 22 by sputtering method and etching. Next, patterning is applied to the gate insulating film 22 and the p-type GaN 17 to form the resurf layer 24 and the resurf layer 54 (FIG. 5).

Figure 6:
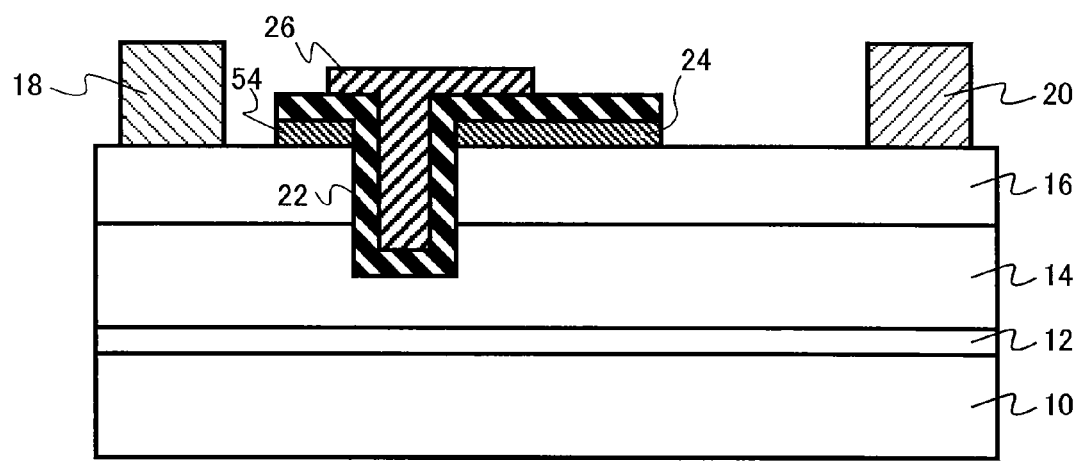
FIG. 6 is a schematic cross-sectional view illustrating the semiconductor device in process of manufacture in the manufacturing method for the semiconductor device according to the first embodiment.

Next, the source electrode 18 and the drain electrode 20 having the stacked structure of titanium (Ti) and aluminum (Al) are formed on the barrier layer 16 by a liftoff process (FIG. 6).

After that, the insulating film 30, source field plate electrode 28, and insulating film 32 are formed, and the semiconductor device 100 illustrated in FIG. 1 is manufactured.

Note that the p-type GaN 17 may be formed by the epitaxial growth of the undoped GaN and ion implantation of a selective p-type impurity such as magnesium.

Next, function and effects of the semiconductor device 100 according to the present embodiment will be described.

Figure 7:
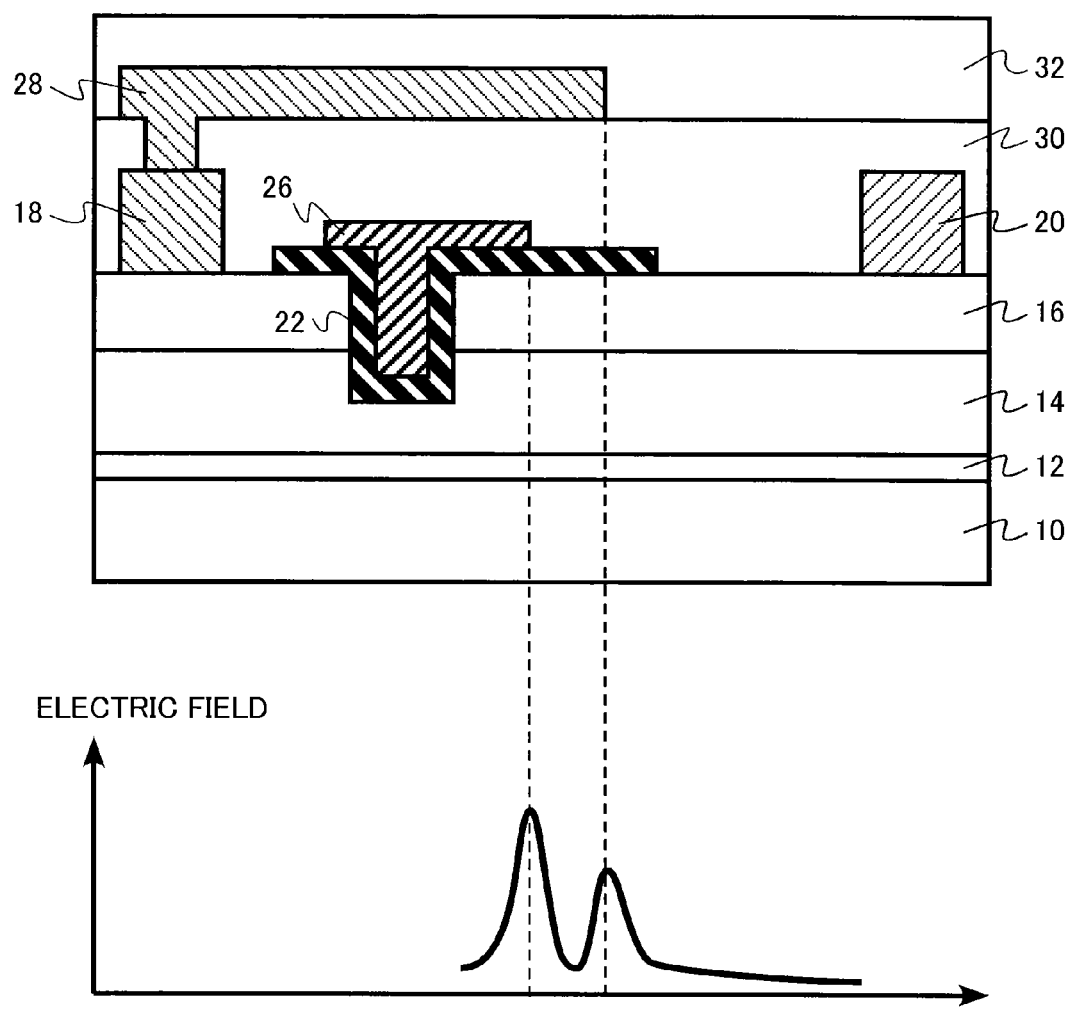
FIG. 7 is an explanatory diagram for function and effects of the semiconductor device according to the first embodiment.
Figure 8:
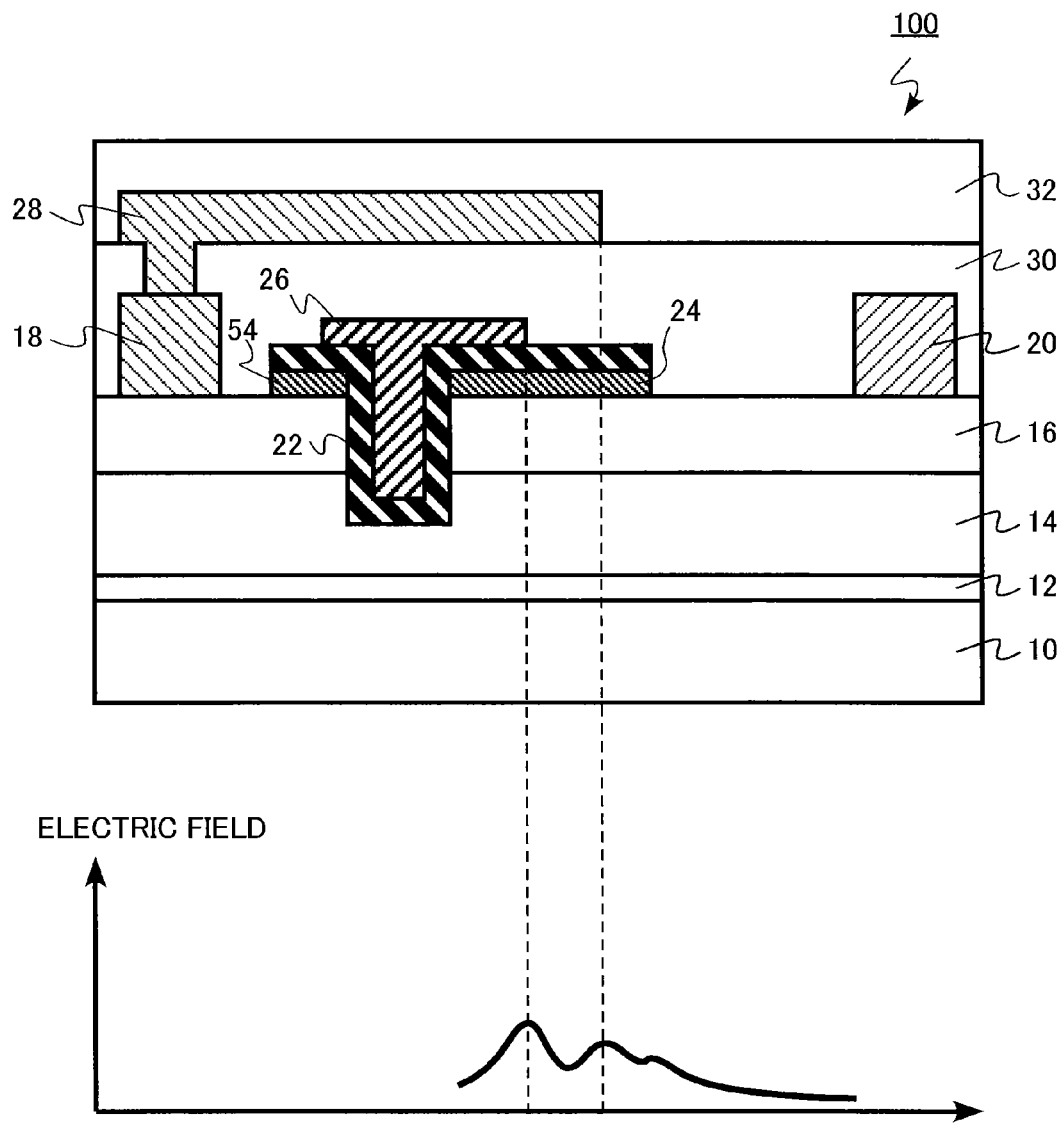
FIG. 8 is an explanatory diagram for the function and effects of the semiconductor device according to the first embodiment.

FIGS. 7 and 8 are explanatory diagrams for the function and effects of the semiconductor device according to the present embodiment. FIG. 7 is the diagram illustrating the HEMT without including the resurf layer, and FIG. 8 is the diagram illustrating the HEMT including the resurf layer according to the present embodiment. In the respective cases, distribution of electric field strength when the HEMT is turned off will be schematically illustrated.

As illustrated in FIG. 7, the electric field concentrates on two points, namely, the end portion on the drain electrode 20 side of the gate electrode 26 and the end portion on the drain electrode 20 side of the source field plate electrode 28 at which peaks of the electric field strength appear. The concentrated electric field is mainly the lateral electric field. Thus, the insulating film and the semiconductor may be damaged and the breakdown voltage may be deteriorated at the places where the electric field is concentrated. The reason for such electric field concentration at the end portions of the electrodes as shown in FIG. 7 is considered to be discontinuous depletion of a two-dimensional electron gas generated on an interface between the barrier layer 16 and the channel layer 14.

As illustrated in FIG. 8, in the case where the resurf layer 24 is provided, the peaks of the electric field strength at the end portion on the drain electrode 20 side of the gate electrode 26 and the end portion on the drain electrode 20 side of the source field plate electrode 28 become gentle, and electric field strength becomes smaller compared to the case without including the resurf layer 24. The reason is considered that discontinuity of expansion of a depletion layer is reduced by positive charge inside the floating resurf layer 24.

Meanwhile, preferably, area density of an acceptor of the resurf layer 24 is lower than the area density of the two-dimensional electron gas generated on the interface between the barrier layer 16 and the channel layer 14 in an area where neither the resurf layer 24 nor the gate electrode 26 is provided. When the area density of the acceptor of the resurf layer 24 becomes higher than the area density of the above-mentioned two-dimensional electron gas, the density of the two-dimensional electron gas may be decreased and the on-resistance may be increased.

Further, preferably, the area density of the acceptor of the resurf layer 24 is higher than 10% of the area density of the two-dimensional electron gas generated on the interface between the barrier layer 16 and the channel layer 14 in the area where neither the resurf layer 24 nor the gate electrode 26 is provided. When the area density of the acceptor of the resurf layer 24 becomes lower than the above-mentioned area density, a sufficient effect of electric field alleviation may not be obtained.

For instance, in the case where the channel layer 14 is the undoped GaN and the barrier layer 16 is undoped $Al_YGa_{1-Y}N$ ($0<Y\le1$), the area density of the two-dimensional electron gas is represented by $y\times4\times10^{13}$ [$cm^{-2}$]. Therefore, in this case, the area density of the acceptor of the resurf layer 24 is preferably lower than $y\times4\times10^{13}$ [$cm^{-2}$] and higher than $y\times0.4\times10^{13}$ [$cm^{-2}$].

Provided that the resurf layer 24 has the film thickness of d [cm] and the acceptor density of $N_A$ [$cm^{-3}$], the area density of the acceptor of the resurf layer 24 is represented by $d\times N_A$ [$cm^{-2}$]. Therefore, preferably, a relation of a following expression is satisfied:

$$y\times0.4\times10^{13}<d\times N_A<y\times4\times10^{13} \quad \text{(Expression 1)}.$$

Note that an activation rate of the p-type impurity inside a p-type GaN based semiconductor is more or less 10%. Therefore, provided that the atomic percentage of the p-type impurity is $N_P$[$cm^2$], the above (Expression 1) is changed to:

$$y\times4\times10^{13}<d\times N_P<y\times40\times10^{13} \quad \text{(Expression 2)}.$$

Preferably, the acceptor density of the resurf layer 24 is $1\times10^{16}$ $cm^{-3}$ or more and $1\times10^{18}$ $cm^{-3}$ or less. The atomic percentage of the p-type impurity of the resurf layer 24 is preferably $1\times10^{17}$ $cm^{-3}$ or more and $1\times10^{19}$ $cm^{-3}$ or less. Further, the film thickness of the resurf layer 24 is preferably 10 nm or more and 100 nm or less. By forming the resurf layer 24 within the ranges of the above acceptor density or atomic percentage of the p-type impurity and the above film thickness, the resurf layer 24 capable of providing sufficient effects of electric field alleviation can be easily formed.

Note that, according to the HEMT 100 of the present embodiment, the p-type resurf layer 54 is also disposed between the gate electrode 26 and the source electrode 18 on the barrier layer 16. The electric field concentration at the end portion on the source electrode 18 side of the gate electrode 26 is alleviated by the resurf layer 54.

As described, according to the semiconductor device of the present embodiment, the semiconductor device achieving to have high breakdown voltage can be provided by the effect of lateral electric field alleviation by the resurf layers 24 and 54.

(Second Embodiment)

A semiconductor device according to a present embodiment is same as a first embodiment except for including a second GaN based semiconductor layer between the first GaN based semiconductor layer and a portion of a gate electrode closest to a first GaN based semiconductor layer. Therefore, repetition of describing the matters same as the first embodiment will be omitted.

Figure 9:
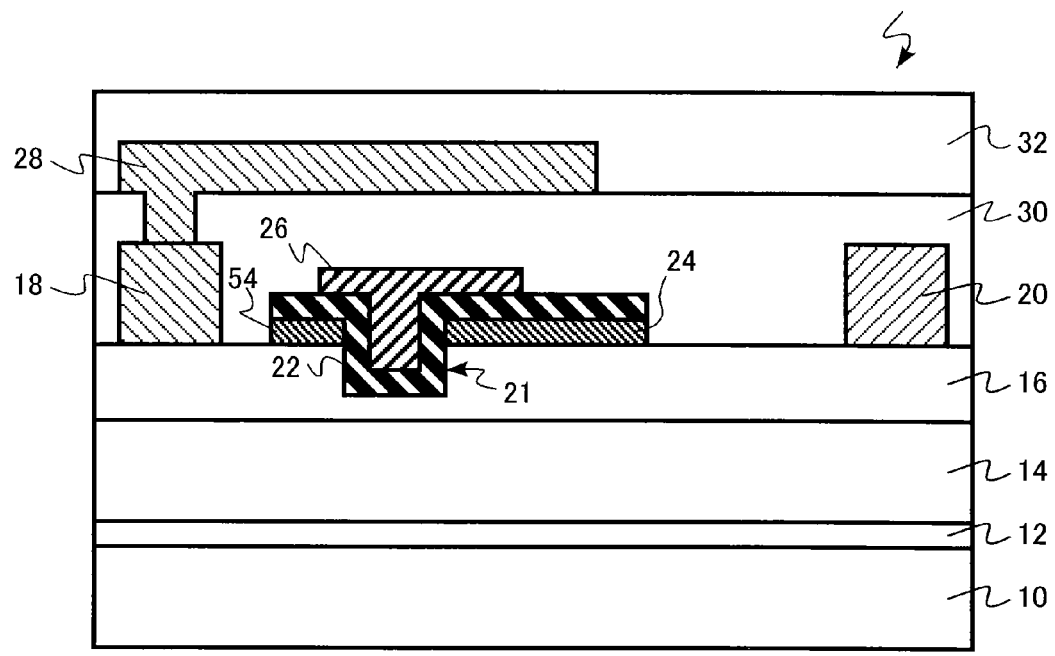
FIG. 9 is a schematic cross-sectional view illustrating a semiconductor device according to a second embodiment.

FIG. 9 is a schematic cross-sectional view illustrating the semiconductor device according to the present embodiment. The semiconductor device according to the present embodiment is an HEMT using a GaN based semiconductor.

As illustrated in FIG. 9, a trench 21 of a semiconductor device (HEMT) 200 is shallower than that of an HEMT 100 of the first embodiment, and a thin barrier layer 16 is located at a bottom portion of the trench 21. The thin barrier layer 16 reduces a polarization amount just below a gate electrode 26, and concentration of two-dimensional electron gas is decreased. Therefore, a normally-off type HEMT can be formed.

According to the present embodiment, the semiconductor device achieving to have high breakdown voltage can be provided same as the first embodiment. Further, since the two-dimensional electron gas exists also in a channel portion just below the gate electrode 26, the semiconductor device having on-resistance lower than the first embodiment can be provided.

(Third Embodiment)

A semiconductor device according to a present embodiment is same as a first embodiment except for that an interface between a second GaN based semiconductor layer and a gate insulating film is sloped. Therefore, repetition of describing the matters same as the first embodiment will be omitted.

Figure 10:
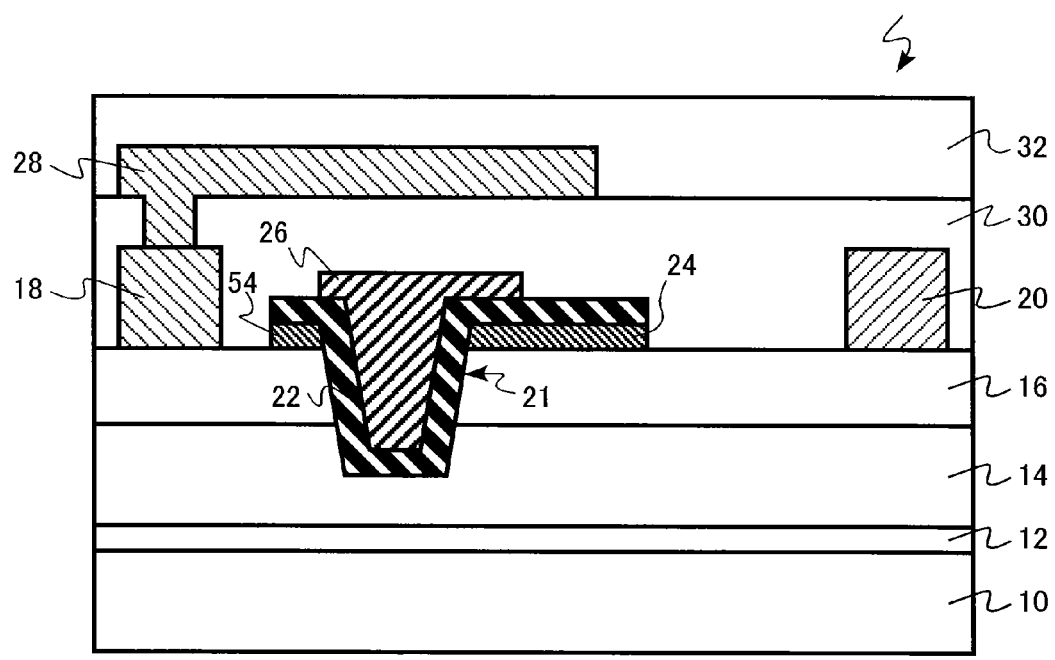
FIG. 10 is a schematic cross-sectional view illustrating a semiconductor device according to a third embodiment.

FIG. 10 is a schematic cross-sectional view illustrating a semiconductor device according to the present embodiment. The semiconductor device according to the present embodiment is an HEMT using a GaN based semiconductor.

As illustrated in FIG. 10, in a semiconductor device (HEMT) 300, a channel layer 14, a barrier layer 16, and an interface between a resurf layer 24 and a gate insulating film 22 are sloped. In other words, a side surface of a trench 21 is sloped with respect to an interface between the channel layer 14 and the barrier layer 16, instead of being vertical thereto.

According to the present embodiment, an effect of electric field alleviation is more increased by the sloped side surface of the trench 21, and the semiconductor device achieving to have higher breakdown voltage can be provided.

Figure 11:
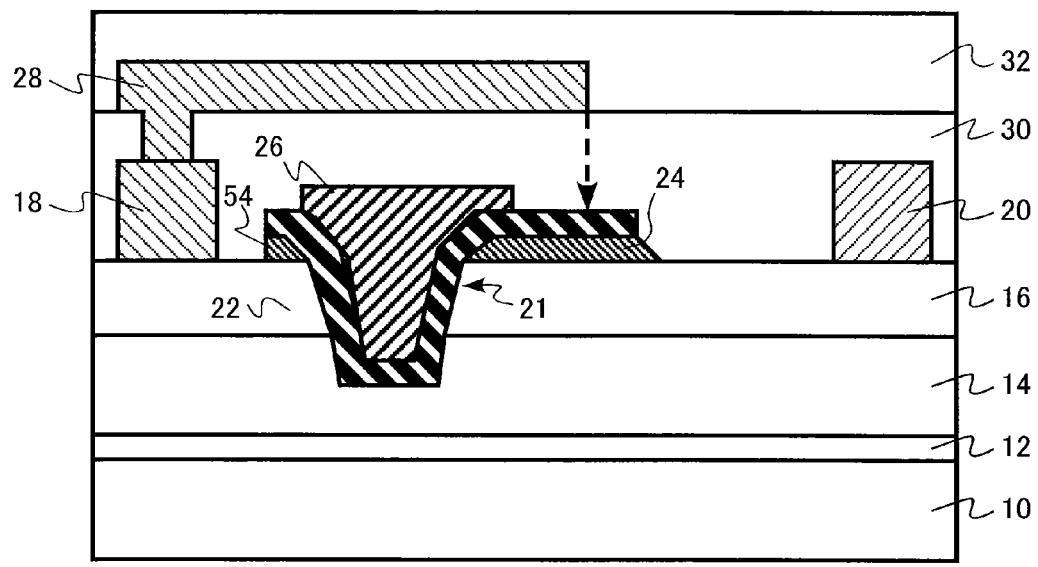
FIG. 11 is a schematic cross-sectional view illustrating a modified example of the semiconductor device according to the third embodiment.

FIG. 11 is a schematic cross-sectional view illustrating a modified example of the semiconductor device according to the present embodiment. As illustrated in FIG. 11, more preferably, the side surface of the trench 21 is gently sloped toward an upper portion of the trench 21 from the standpoint of electric field alleviation. Further, more preferably, a side wall of the end portion on the drain electrode 20 side of the resurf layer 24 is also sloped as illustrated in FIG. 11 from the standpoint of electric field alleviation at the end portion of the resurf layer 24.

(Fourth Embodiment)

A semiconductor device according to a present embodiment is same as a first embodiment except for further including a protection film made of a material different from a gate insulating film and disposed between the gate insulating film and a third GaN based semiconductor layer. Therefore, repetition of describing the matters same as the first embodiment will be omitted.

Figure 12:
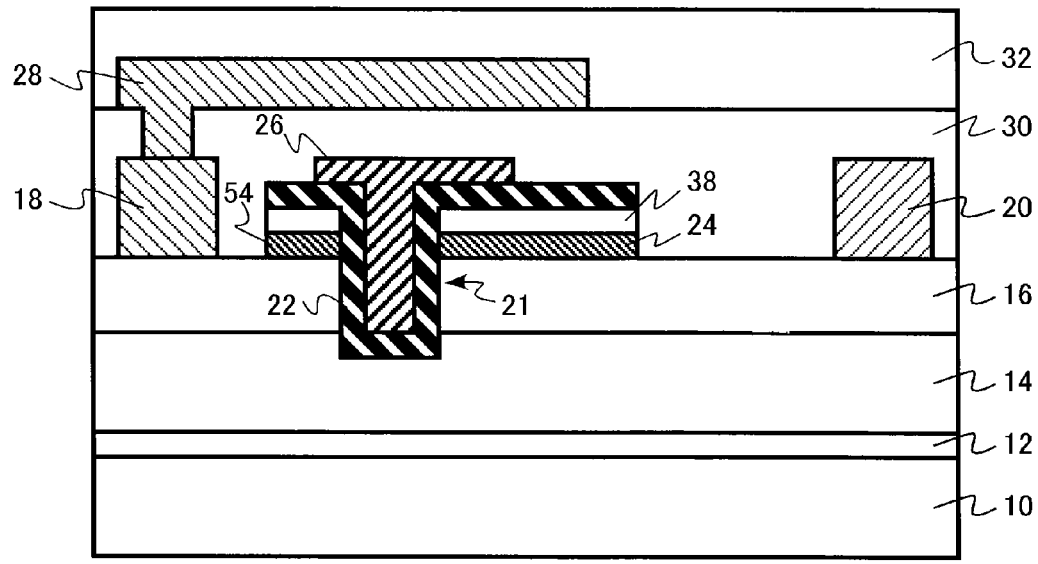
FIG. 12 is a schematic cross-sectional view illustrating a semiconductor device according to a fourth embodiment.

FIG. 12 is a schematic cross-sectional view illustrating the semiconductor device according to the present embodiment. The semiconductor device according to the present embodiment is an HEMT using a GaN based semiconductor.

As illustrated in FIG. 12, a semiconductor device (HEMT) 400 includes a protection film 38 made of the material different from a gate insulating film 22 and disposed between the gate insulating film 22 and a resurf layer 24. In the case where the gate insulating film 22 is, for example, a silicon oxide film or an aluminum oxide film, the protection film 38 is a silicon nitride film or a silicon oxynitride film.

For example, an interface level in a space with the resurf layer 24 is lowered by using the silicon nitride film or silicon oxynitride film as the protection film 38. Therefore, for example, current collapse hardly occurs, and reliability of the HEMT is improved. Further, since the protection film 38 is interposed between the gate electrode 26 and the resurf layer 24, an electric field applied to the gate insulating film 22 is alleviated, thereby improving reliability.

According to the present embodiment, the semiconductor device achieving to have high breakdown voltage can be provided same as the first embodiment. Further, the semiconductor device having excellent reliability can be provided.

Figure 13:
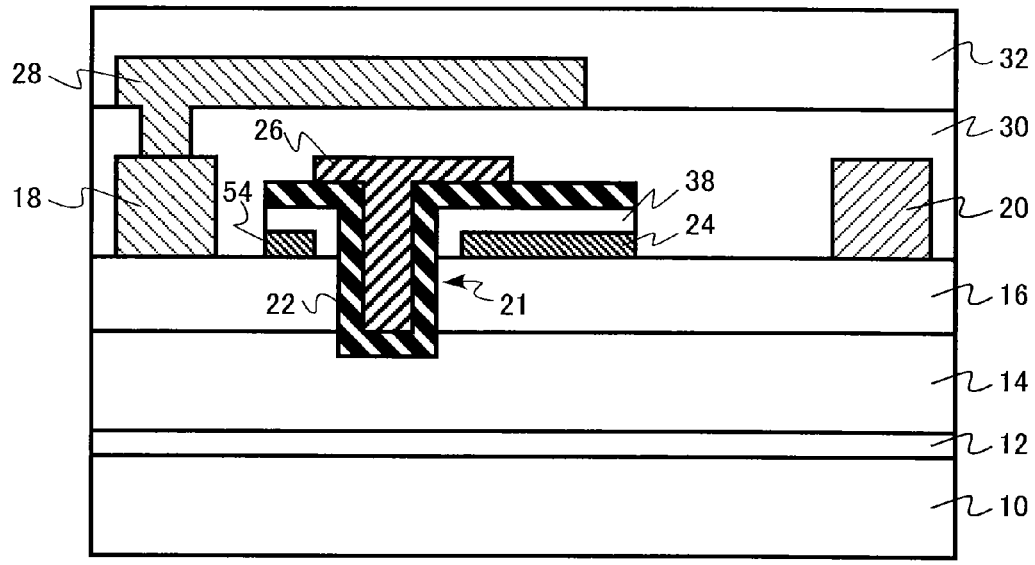
FIG. 13 is a schematic cross-sectional view illustrating a modified example of the semiconductor device according to the fourth embodiment.

FIG. 13 is a schematic cross-sectional view illustrating a modified example of the semiconductor device according to the present embodiment. From the standpoint of improvement of reliability on the gate insulating film 22, a configuration in which the protection film 38 is disposed between the gate insulating film 22 and the resurf layer 24 at a side surface portion of a trench 21 may also be possible as illustrated in FIG. 13.

(Fifth Embodiment)

A semiconductor device according to a present embodiment is same as a first p-type embodiment except for further including a fifth GaN based semiconductor layer disposed between a third GaN based semiconductor layer and a drain electrode on a second GaN based semiconductor layer on an opposite side of a first GaN based semiconductor layer, and separated from the third GaN based semiconductor layer. Therefore, repetition of describing the matters same as the first embodiment will be omitted.

Figure 14:
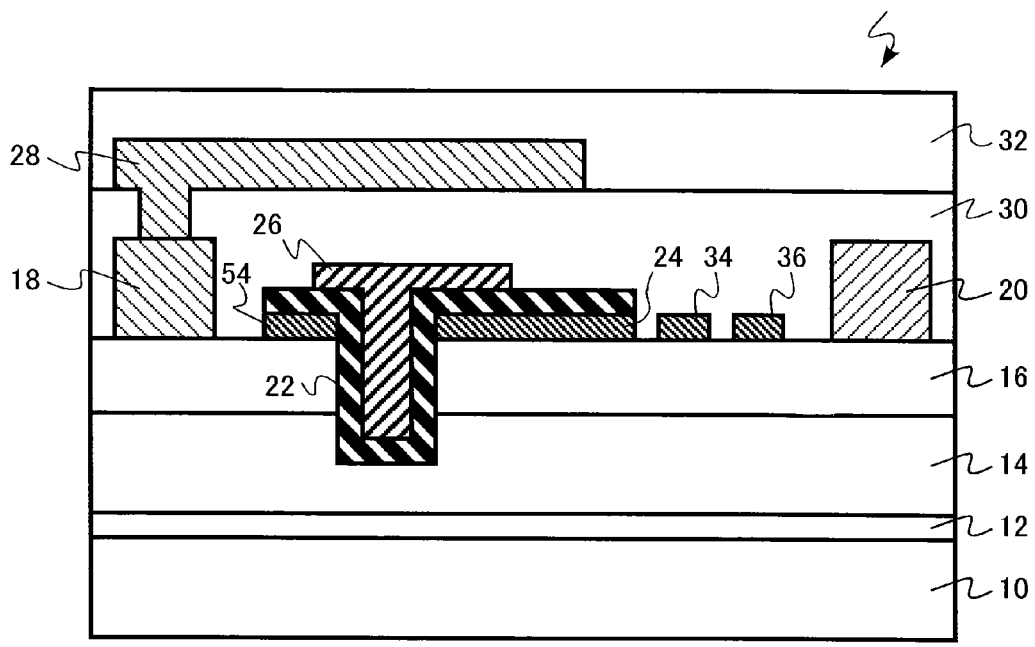
FIG. 14 is a schematic cross-sectional view illustrating a semiconductor device according to a fifth embodiment.

FIG. 14 is a schematic cross-sectional view illustrating the semiconductor device according to the present embodiment. The semiconductor device according to the present embodiment is an HEMT using a GaN based semiconductor.

As illustrated in FIG. 14, a semiconductor device (HEMT) 500 includes a plurality of resurf layers, more specifically, a resurf layer (third GaN based semiconductor layer) 24, a resurf layer (fifth GaN based semiconductor layer) 34, and a resurf layer (fifth GaN based semiconductor layer) 36, between a gate electrode 26 and a drain electrode 20.

The resurf layers (fifth GaN based semiconductor layers) 34, 36 are disposed between the resurf layer 24 and the drain electrode 20 on a barrier layer 16. The resurf layers 34, 36 are separated from the resurf layer 24.

According to the present embodiment, the plurality of the resurf layers is disposed between the gate electrode 26 and the drain electrode 20 on the barrier layer 16, thereby further alleviating a lateral electric field and achieving to provide the semiconductor device have high breakdown voltage.

(Sixth Embodiment)

A semiconductor device according to a present embodiment is same as a first embodiment except for including a sixth i-type GaN based semiconductor layer between a second GaN based semiconductor layer and a third GaN based semiconductor layer. Therefore, repetition of describing the matters same as the first embodiment will be omitted.

Figure 15:
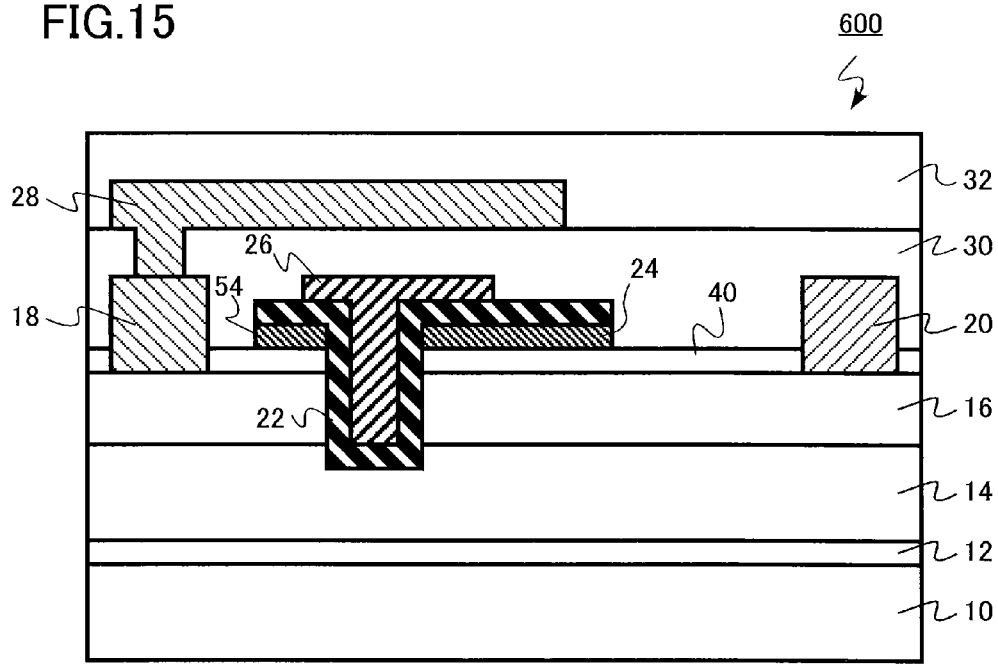
FIG. 15 is a schematic cross-sectional view of a semiconductor device according to a sixth embodiment.

FIG. 15 is a schematic cross-sectional view illustrating the semiconductor device according to the present embodiment. The semiconductor device according to the present embodiment is an HEMT using a GaN based semiconductor.

As illustrated in FIG. 15, a semiconductor device (HEMT) 600 includes an i (intrinsic) type GaN layer (sixth GaN based semiconductor layer) 40 between a barrier layer 16 and a resurf layer 24.

According to the semiconductor device of the present embodiment, same as the first embodiment, a lateral electric field is alleviated by the resurf layer 24 and the semiconductor device achieving to have high breakdown voltage can be provided.

(Seventh Embodiment)

A semiconductor device according to a present embodiment is same as a first embodiment except for further including a second field plate electrode, interposing an insulating film in a space with a first field plate electrode and interposing an insulating film in a space with a third GaN based semiconductor layer, and the third GaN based semiconductor layer is located between a second GaN based semiconductor layer and an end portion on a drain electrode side of the second field plate electrode. Therefore, repetition of describing the matters same as the first embodiment will be omitted.

Figure 16:
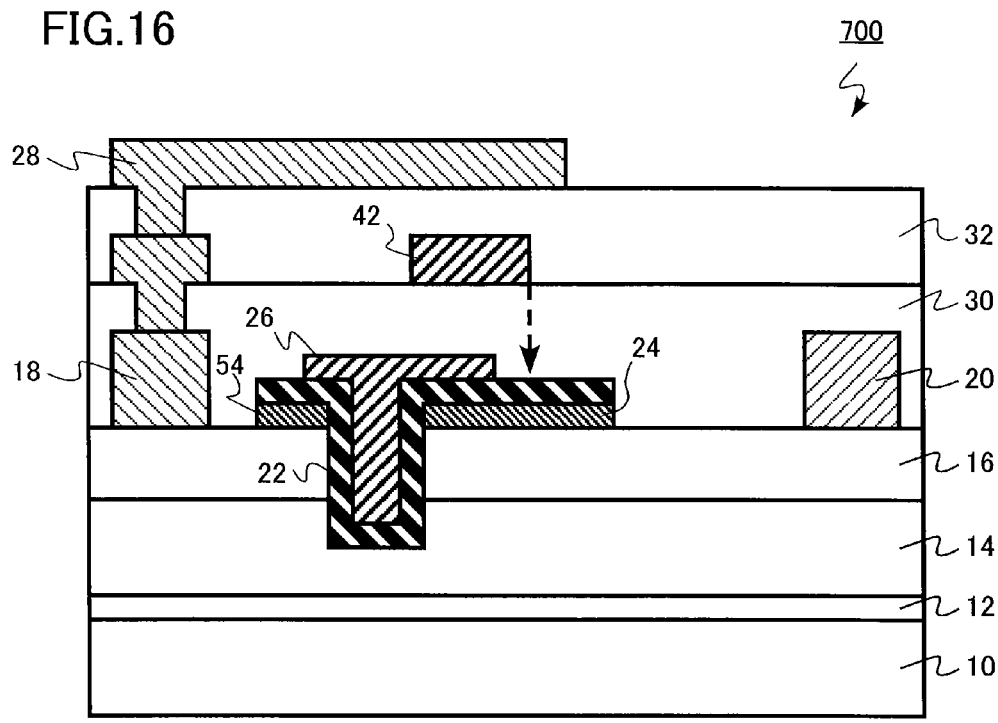
FIG. 16 is a schematic cross-sectional view illustrating a semiconductor device according to a seventh embodiment.

FIG. 16 is a schematic cross-sectional view of the semiconductor device according to the present embodiment. The semiconductor device according to the present embodiment is an HEMT using a GaN based semiconductor.

As illustrated in FIG. 16, a semiconductor device (HEMT) 700 includes a gate field plate electrode (second field plate electrode) 42, interposing an insulating film 32 in the space with a source field plate electrode (first field plate electrode) 28 and also interposing an insulating film 30 in a space with a resurf layer 24. As indicated by a dotted arrow in FIG. 1, the resurf layer 24 is located between a barrier layer 16 (second GaN based semiconductor layer) and an end portion on a drain electrode 20 side of the gate field plate electrode 42.

Therefore, concentration of a lateral electric field at the end portion on the drain electrode 20 side of the gate field plate electrode 42 is alleviated by the resurf layer 24.

As described above, according to the semiconductor device of the present embodiment, the semiconductor device achieving to have high breakdown voltage can be provided by including the gate field plate electrode 42, in addition to effects of the first embodiment.

(Eighth Embodiment)

A semiconductor device according to a present embodiment is same as a first embodiment except for further including: a seventh GaN based semiconductor layer between a buffer layer and a channel layer; and an eighth GaN based semiconductor layer disposed on the seventh GaN based semiconductor layer and having a bandgap larger than a bandgap of the seventh GaN based semiconductor layer. Therefore, repetition of describing the matters same as the first embodiment will be omitted.

Figure 17:
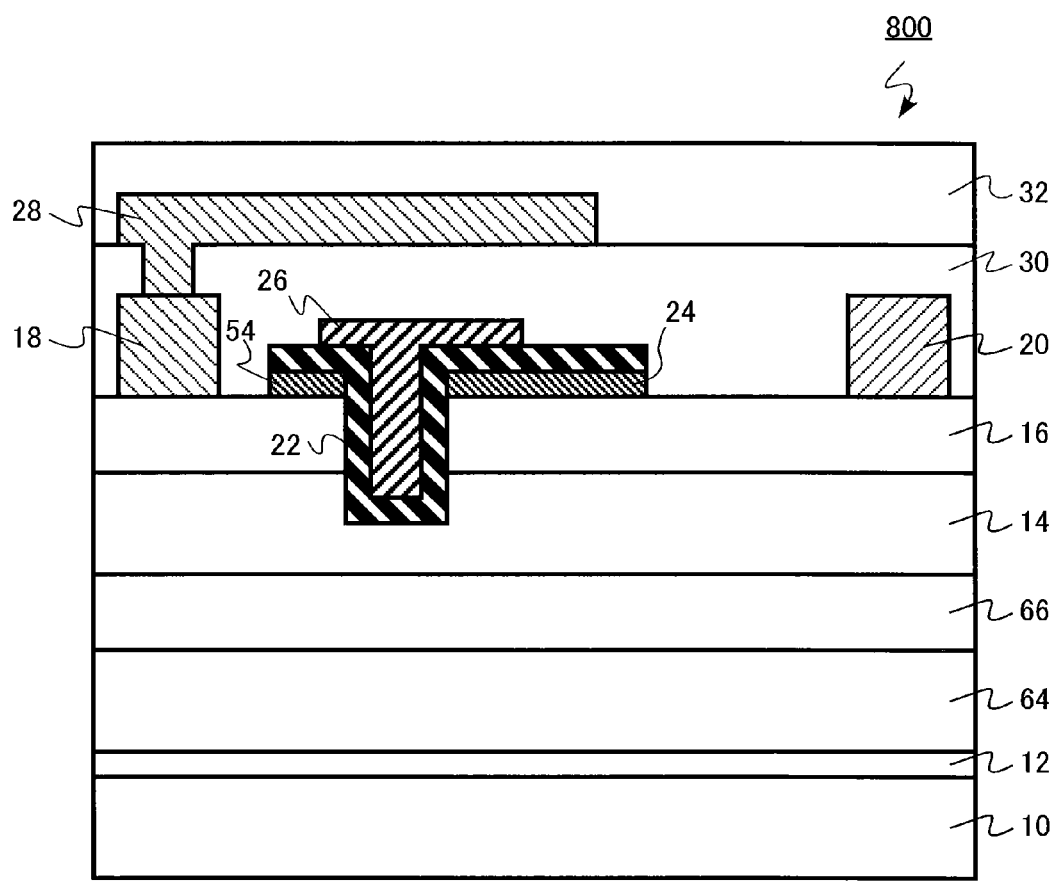
FIG. 17 is a schematic cross-sectional view illustrating a semiconductor device according to a eighth embodiment.

FIG. 17 is a schematic cross-sectional view of the semiconductor device according to the present embodiment. The semiconductor device according to the present embodiment is an HEMT using a GaN based semiconductor.

As illustrated in FIG. 17, a semiconductor device (HEMT) 800 includes a second channel layer 64 and a second barrier layer 66 on a buffer layer 12.

The second channel layer 64 is, for example, undoped $Al_XGa_{1-X}N$ (1≤X<0). More specifically, the second channel layer 64 is undoped GaN, for example. The second channel layer 64 has film thickness of 0.5 µm or more and 3 µm or less.

The second barrier layer 66 is disposed on the second channel layer 64. The second barrier layer 66 has the bandgap larger than the bandgap of the second channel layer 64. The second barrier layer 66 is, for example, undoped $Al_YGa_{1-Y}N$ (0<Y≤1, X<Y). More specifically, the barrier layer is undoped $Al_{0.2}Ga_{0.8}N$, for example. The second barrier layer 66 has the film thickness of, for example, 3 nm or more and 50 nm or less.

A heterojunction interface is provided between the second channel layer 64 and the second barrier layer 66. When the HEMT 800 is turned on, two-dimensional electron gas (2DEG) is generated on the heterojunction interface.

According to the HEMT 800 of the present embodiment, the two-dimensional electron gas (2DEG) is formed in the two layers. Therefore, the HEMT having lowered on-resistance can be achieved.

According to the semiconductor device of the present embodiment, same as the first embodiment, a lateral electric field is alleviated by the resurf layer 24 and the semiconductor device achieving to have high breakdown voltage can be provided. Further, the semiconductor device having the more lowered on-resistance can be provided.

(Ninth Embodiment)

A semiconductor device according to a present embodiment is same as a first embodiment except for not including a first field plate electrode. Therefore, repetition of describing the matters same as the first embodiment will be omitted.

Figure 18:
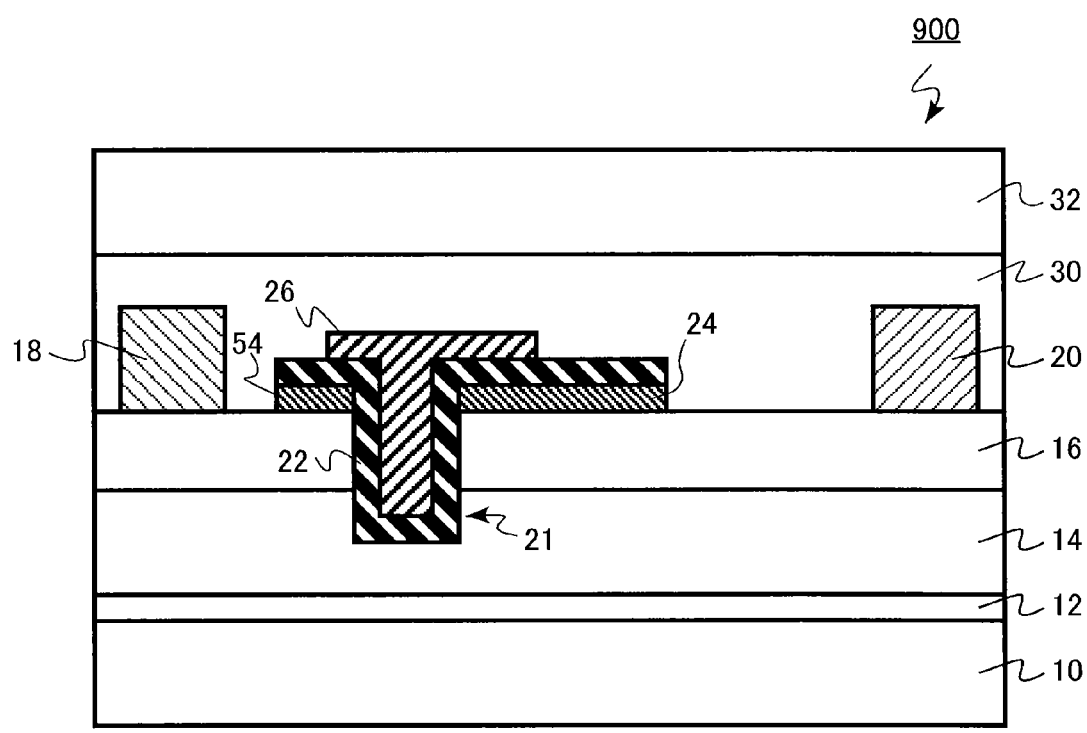
FIG. 18 is a schematic cross-sectional view illustrating a semiconductor device according to a ninth embodiment.

FIG. 18 is a schematic cross-sectional view illustrating the semiconductor device according to the present embodiment. The semiconductor device according to the present embodiment is an HEMT using a GaN based semiconductor.

As illustrated in FIG. 18, a semiconductor device (HEMT) 900 does not include the source field plate electrode, different from an HEMT 100 of the first embodiment.

According to the semiconductor device of the present embodiment, concentration of an electric field at an end portion on a drain electrode 20 side of a gate electrode 26 is alleviated by a resurf layer 24. Therefore, according to the present embodiment, the semiconductor device capable of reducing parasitic capacitance in a space with the field plate electrode and also achieving to have high breakdown voltage can be provided by an effect of lateral electric field alleviation by the resurf layer 24.

According to the embodiments, examples of applying GaN and AlGaN as the material of the GaN based semiconductor layer have been described, but InGaN, InAlN, and InAlGaN including indium (In), for example, may also be applicable. Further, AlN may be applied as the material of the GaN based semiconductor layer.

Additionally, according to the embodiments, the example of applying the undoped AlGaN as the barrier layer has been described, but n-type AlGaN may also be applicable.

While certain embodiments have been described, these embodiments have been presented by way of example only, and are not intended to limit the scope of the inventions. Indeed, the semiconductor device and the manufacturing method therefor described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first GaN based semiconductor layer;
   a second GaN based semiconductor layer disposed on the first GaN based semiconductor layer, the second GaN based semiconductor layer having a bandgap larger than a bandgap of the first GaN based semiconductor layer;
   a source electrode disposed on the second GaN based semiconductor layer, the second GaN based semiconductor layer having a first film thickness between the source electrode and the first GaN based semiconductor;
   a drain electrode disposed on the second GaN based semiconductor layer;
   a gate electrode disposed between the source electrode and the drain electrode, a gate insulating film being disposed between the gate electrode and the first GaN based semiconductor layer, a part of the gate insulating film being in contact with the first GaN based semiconductor layer, the gate insulating film being separated from the drain electrode, the second GaN based semiconductor layer having a second film thickness between the gate electrode and the first GaN based semiconductor layer, the second film thickness being thinner than the first film thickness;
   a p-type third GaN based semiconductor layer disposed between the second GaN based semiconductor layer and an end portion on the drain electrode side of the gate electrode, the gate insulating film being disposed between the gate electrode and the third GaN based semiconductor layer, the third GaN based semiconductor layer disposed on the second GaN based semiconductor layer, p-type impurity concentration of the p-type third GaN based semiconductor layer being $1 \times 10^{17}$ cm$^{-3}$ or more and $1 \times 10^{19}$ cm$^{-3}$ or less, film thickness of the p-type third GaN based semiconductor layer being 10 nm or more and 100nm or less;
   an insulating film disposed on the third GaN based semiconductor layer on an opposite side of the second GaN based semiconductor layer; and
   a first field plate electrode, the insulating film being disposed between the first field plate electrode and the third GaN based semiconductor layer,
   wherein the third GaN based semiconductor layer is located between the second GaN based semiconductor layer and an end portion on the drain electrode side of the first field plate electrode.

2. The device according to claim 1, wherein the third GaN based semiconductor layer is a floating layer.

3. The device according to claim 1, wherein the gate insulating film contacts the first GaN based semiconductor layer.

4. The device according to claim 1, wherein the third GaN based semiconductor layer has area density of an acceptor lower than area density of two-dimensional electron gas generated on an interface between the first GaN based semiconductor layer and the second GaN based semiconductor layer.

5. The device according to claim 1, wherein the interface between the second GaN based semiconductor layer and the gate insulating film is sloped.

6. The device according to claim 1, further comprising a protection film disposed between the gate insulating film and the third GaN based semiconductor layer, the protection film made of material different from the gate insulating film.

7. The device according to claim 1, further comprising a p-type fourth GaN based semiconductor layer disposed between the second GaN based semiconductor layer and an end portion on the source electrode side of the gate electrode, the gate insulating film being disposed between the gate electrode and the fourth GaN based semiconductor layer.

8. The device according to claim 1, further comprising a p-type fifth GaN based semiconductor layer disposed between the third GaN based semiconductor layer and the drain electrode on the second GaN based semiconductor layer on an opposite side of the first GaN based semiconductor layer, the fifth GaN based semiconductor being separated from the third GaN based semiconductor layer.

9. The device according to claim 1, further comprising a second field plate electrode, an insulating film being disposed between the second field plate electrode and the first field plate electrode, an insulating film being disposed between the second field plate electrode and the third GaN based semiconductor layer,
wherein the third GaN based semiconductor layer is located between the second GaN based semiconductor layer and an end portion on the drain electrode side of the second field plate electrode.

10. A manufacturing method for a semiconductor device, comprising:
forming a second GaN based semiconductor layer on a first GaN based semiconductor layer by an epitaxial growth process, the second GaN based semiconductor layer having a bandgap larger than a bandgap of the first GaN based semiconductor layer;
forming a third p-type GaN based semiconductor layer on the second GaN based semiconductor layer;
forming a trench penetrating through the p-type third GaN based semiconductor layer, the trench reaching the second GaN based semiconductor layer;
forming a gate insulating films directly on the trench and a surface of the third GaN based semiconductor layer;
forming a gate electrode on the gate insulating film;
forming a source electrode on one side of the gate electrode on the second GaN based semiconductor layer;
forming a drain electrode on the other side of the gate electrode on the second GaN based semiconductor layer;
forming an insulating film on the gate electrode; and
forming a first field plate electrode on the insulating film,
wherein the gate insulating film is separated from the drain electrode;
wherein p-type impurity concentration of the p-type third GaN based semiconductor layer is $1 \times 10^{17}$ cm$^{-3}$ or more and $1 \times 10^{19}$ cm$^{-3}$ or less, film thickness of p-type third GaN based semiconductor layer is 10nm or more and 100 nm or less; and
wherein the third GaN based semiconductor layer is located between the second GaN based semiconductor layer and an end portion on the drain electrode side of the first field plate electrode.

11. The method according to claim 10, wherein the third p-type GaN based semiconductor layer is formed by the epitaxial growth process.

* * * * *